United States Patent
Abe et al.

(10) Patent No.: US 12,302,500 B2
(45) Date of Patent: May 13, 2025

(54) POWER CONVERSION DEVICE INCLUDING SUBSTRATES WITH CONNECTORS

(71) Applicant: Mitsubishi Electric Corporation, Tokyo (JP)

(72) Inventors: Naoya Abe, Tokyo (JP); Kenta Fujii, Tokyo (JP); Yoshihiro Takeshima, Tokyo (JP); Satoshi Ishibashi, Tokyo (JP); Yujiro Nakada, Tokyo (JP); Yukiko Nakanishi, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 169 days.

(21) Appl. No.: 17/969,285

(22) Filed: Oct. 19, 2022

(65) Prior Publication Data

US 2023/0130570 A1    Apr. 27, 2023

(30) Foreign Application Priority Data

Oct. 27, 2021    (JP) .................................. 2021-175336

(51) Int. Cl.
*H05K 1/18*    (2006.01)
*H05K 1/14*    (2006.01)

(52) U.S. Cl.
CPC .............. *H05K 1/181* (2013.01); *H05K 1/14* (2013.01); *H05K 2201/10151* (2013.01); *H05K 2201/10189* (2013.01); *H05K 2201/10272* (2013.01)

(58) Field of Classification Search
CPC ............ H01Q 1/48; H01L 2224/05573; H01L 2224/13139; H01L 2924/014;

(Continued)

(56) References Cited

U.S. PATENT DOCUMENTS

2004/0196682 A1* 10/2004 Funaba ..................... H05K 1/14
                                                          365/149
2014/0092663 A1*  4/2014 Shimizu ............. H05K 7/20254
                                                          363/141
2021/0391236 A1* 12/2021 Tsuyuno ............. H01L 23/3735

FOREIGN PATENT DOCUMENTS

JP     2010-035347 A       2/2010
JP     2018-142661 A       9/2018
JP       2020150749 A  *   9/2020

OTHER PUBLICATIONS

Japanese Office Action of No. 2021-175336 dated Sep. 6, 2022.

* cited by examiner

*Primary Examiner* — James Wu
*Assistant Examiner* — Dakota M Talbert
(74) *Attorney, Agent, or Firm* — Sughrue Mion, PLLC

(57) ABSTRACT

Provided is a power conversion device with which a region in which an electronic component is mountable in a first printed wiring board of a first substrate can be enlarged. The power conversion device includes a power module installing member, a power module, a bus bar assembly, a first substrate provided on the bus bar assembly, and a second substrate provided on the bus bar assembly. The first substrate includes a first printed wiring board, and a signal terminal connector and a first board-to-board connection connector which are each provided on the first printed wiring board. The second substrate includes a second printed wiring board and a second board-to-board connection connector provided on the second printed wiring board. The signal terminal connector is connected to a signal terminal of the power module. The first board-to-board connection connector and the second board-to-board connection connector are connected to each other.

8 Claims, 15 Drawing Sheets

(58) Field of Classification Search
CPC ..... H01L 2924/1421; H01L 2924/1423; G06F 1/263; G06F 13/4282; G06F 1/18; G06F 1/3253; H05K 2201/10272; H05K 1/14
See application file for complete search history.

POWER CONVERSION DEVICE INCLUDING SUBSTRATES WITH CONNECTORS

BACKGROUND OF THE INVENTION

1. Field of the Invention

This disclosure relates to a power conversion device.

2. Description of the Related Art

Hitherto, there has been known a power conversion device including a power module, a first substrate mounted to the power module, a bus bar assembly mounted to the power module, and a second substrate mounted to the bus bar assembly. The first substrate includes a first printed wiring board and a first board-to-board connection connector. The second substrate includes a second printed wiring board and a second board-to-board connection connector. The first printed wiring board is arranged between the power module and the bus bar assembly. The bus bar assembly is arranged between the second printed wiring board and the first printed wiring board. The first board-to-board connection connector and the second board-to-board connection connector are connected to each other (see, for example, Japanese Patent Application Laid-open No. 2020-150749).

However, the first printed wiring board is fastened to the power module by a plurality of screws. As a result, an electronic component cannot be arranged in parts in which the screws are arranged in the first printed wiring board. Thus, there has been a problem in that a region in which the electronic component is mountable in the first printed wiring board is reduced.

SUMMARY OF THE INVENTION

This disclosure has been made in order to solve the above-mentioned problem, and has an object to provide a power conversion device with which a region in which an electronic component is mountable in a first printed wiring board of a first substrate can be enlarged.

According to at least one embodiment of this disclosure, there is provided a power conversion device including: a power module installing member; a power module provided on the power module installing member; a bus bar assembly provided on the power module installing member; a first substrate provided on the bus bar assembly; and a second substrate provided on one of the power module installing member or the bus bar assembly, wherein the power module is arranged between the power module installing member and the bus bar assembly, wherein the first substrate includes a first printed wiring board arranged between the power module and the bus bar assembly, and a first connector and a second connector which are each provided on the first printed wiring board, wherein the second substrate includes a second printed wiring board and a third connector provided on the second printed wiring board, wherein the bus bar assembly is arranged between the first printed wiring board and the second printed wiring board, wherein the first connector is connected to a signal terminal of the power module, and wherein the second connector and the third connector are connected to each other.

According to the power conversion device of the at least one embodiment of this disclosure, the region in which the electronic component is mountable in the first printed wiring board of the first substrate can be enlarged.

DESCRIPTION OF THE EMBODIMENTS

First Embodiment

Figure 1:
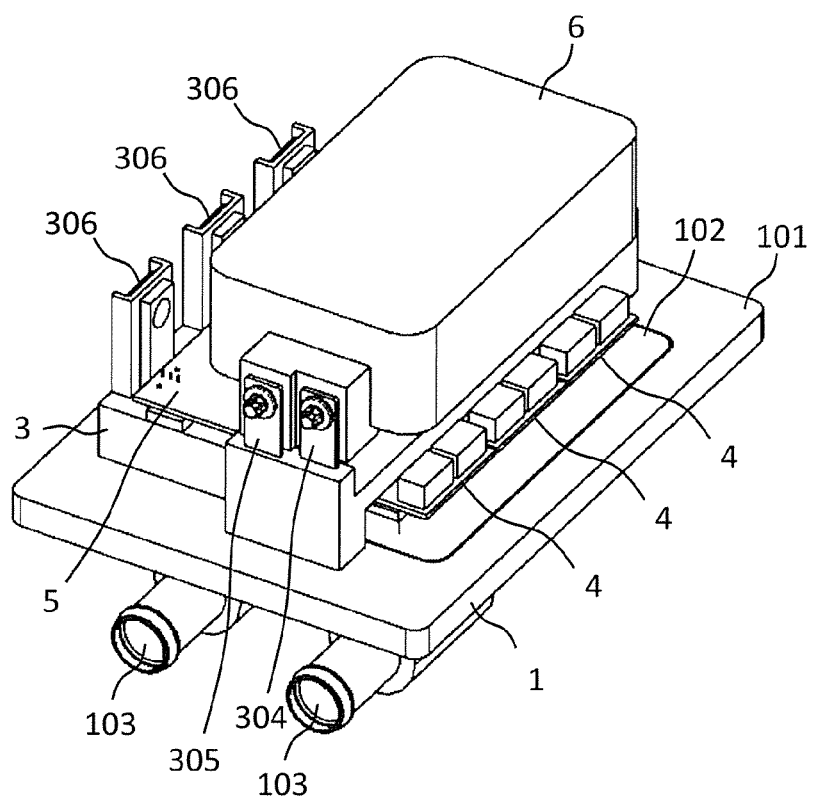
FIG. 1 is a perspective view for illustrating a power conversion device according to a first embodiment of this disclosure.
Figure 2:
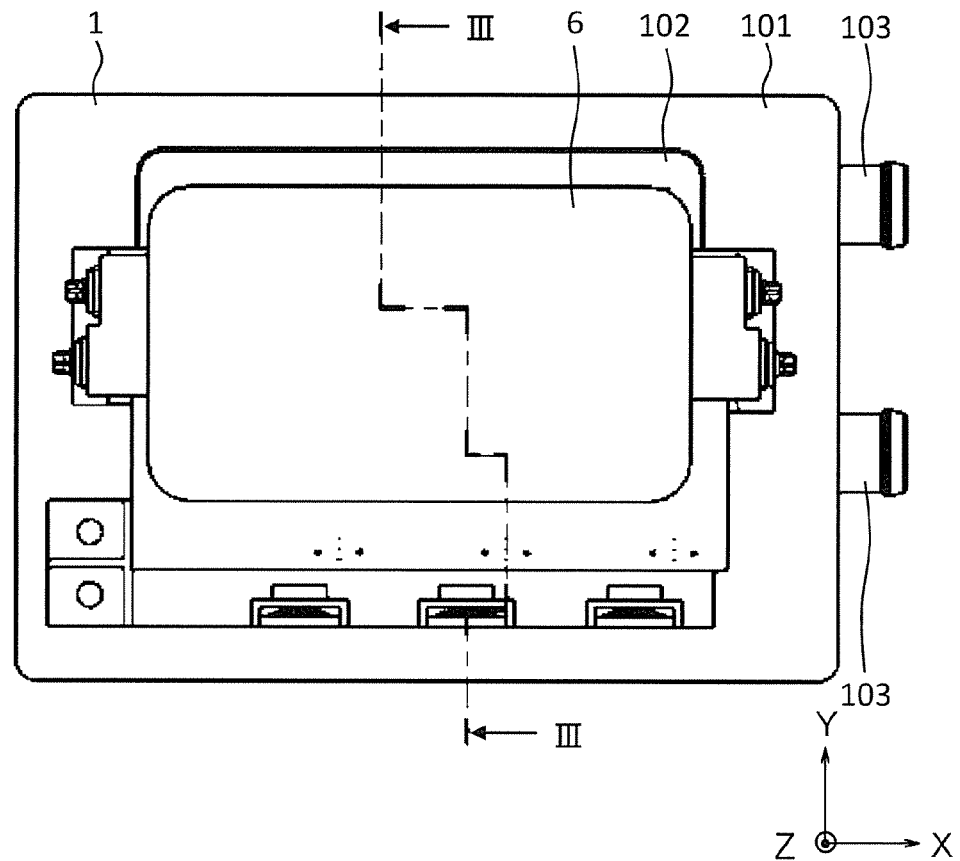
FIG. 2 is a plan view for illustrating the power conversion device of FIG. 1.
Figure 3:
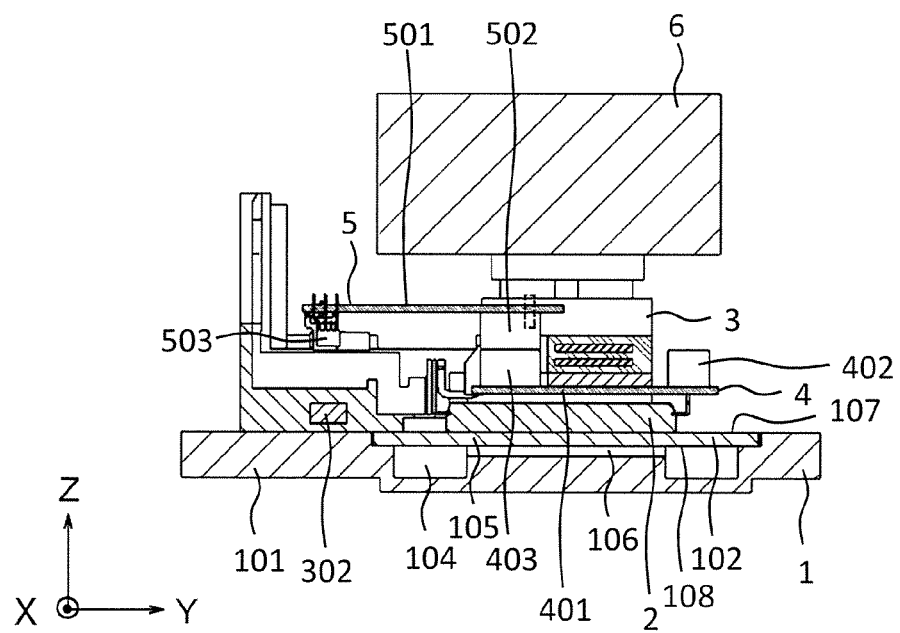
FIG. 3 is a sectional view taken along the line III-III of FIG. 2 when viewed in the direction of the arrows.
Figure 4:
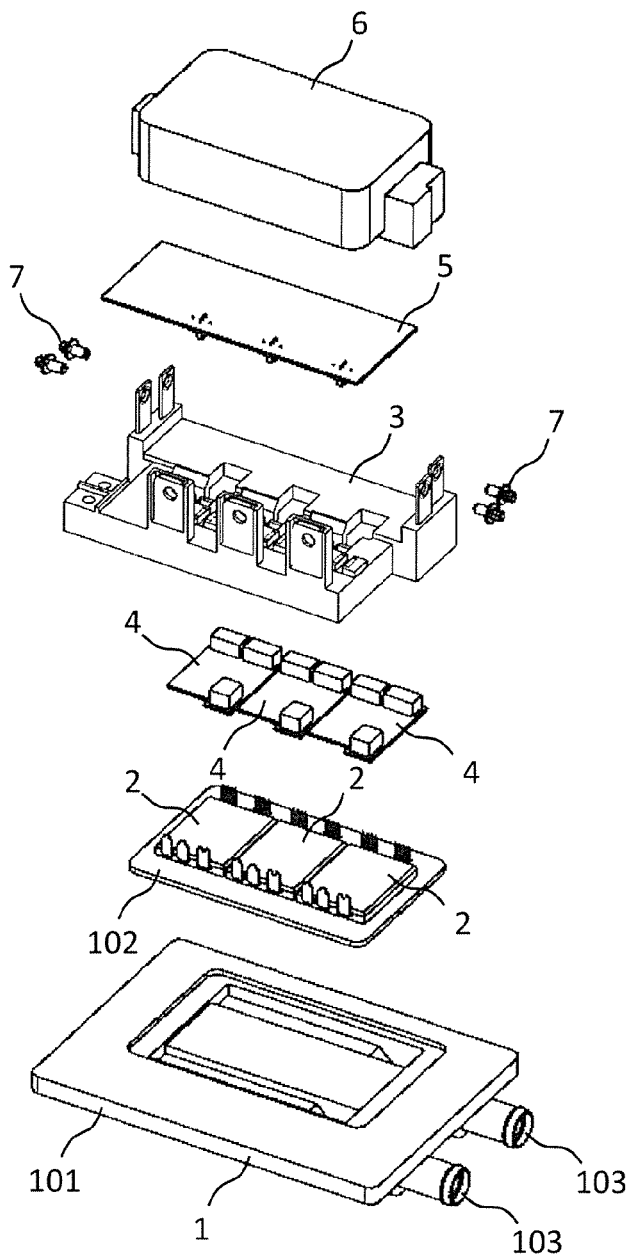
FIG. 4 is an exploded perspective view for illustrating the power conversion device of FIG. 1.

FIG. 1 is a perspective view for illustrating a power conversion device according to a first embodiment of this disclosure. FIG. 2 is a plan view for illustrating the power conversion device of FIG. 1. FIG. 3 is a sectional view taken along the line III-III of FIG. 2 when viewed in the direction of the arrows. FIG. 4 is an exploded perspective view for illustrating the power conversion device of FIG. 1. The power conversion device according to the first embodiment is used for, for example, an electrically powered vehicle. Examples of the electrically powered vehicle include a hybrid vehicle and an electric vehicle.

The power conversion device according to the first embodiment includes a power module installing member 1, three power modules 2, a bus bar assembly 3, three first substrates 4, a second substrate 5, and a smoothing capacitor 6.

The power module installing member 1 has a function of cooling each of the power modules 2. The power module installing member 1 includes a support member 101, a cooling plate 102 provided on the support member 101, and two pipes 103 provided on the support member 101. Between the support member 101 and the cooling plate 102, a flow path 104 through which a cooling refrigerant flows is formed. The cooling refrigerant enters the flow path 104 via one of the two pipes 103, and the cooling refrigerant exits out of the flow path 104 via the other of the two pipes 103. Examples of the cooling refrigerant flowing through the flow path 104 include water.

The cooling plate 102 includes a power module mounting portion 105 and a plurality of cooling fins 106. The power module mounting portion 105 is formed into a plate shape. One of a pair of surfaces facing each other in a thickness direction in the power module mounting portion 105 is referred to as "mounting surface 107," and the other of the pair of surfaces is referred to as "cooling surface 108." The power modules 2 are mounted on the mounting surface 107. The plurality of cooling fins 106 are provided on the cooling surface 108. The cooling surface 108 faces the flow path 104.

The three power modules 2 are arranged side by side along the mounting surface 107 of the power module mounting portion 105. A direction in which the three power modules 2 are arranged side by side is defined as "X direction." A direction orthogonal to the X direction in a plane extending along the mounting surface 107 is defined as "Y direction." A direction orthogonal to the plane extending along the mounting surface 107 is defined as "Z direction."

When the cooling refrigerant flows through the flow path 104, the cooling fins 106 are cooled. When the cooling fins 106 are cooled, the cooling plate 102 is cooled. When the cooling plate 102 is cooled, the power modules 2 are cooled.

The bus bar assembly 3 is provided on the power module installing member 1. The power modules 2 are arranged between the bus bar assembly 3 and the power module installing member 1. The bus bar assembly 3 is fixed to the power module installing member 1 by a plurality of screws (not shown).

The three first substrates 4 are arranged side by side in the direction in which the three power modules 2 are arranged side by side. In other words, the three first substrates 4 are arranged side by side in the X direction. Each of the first substrates 4 is provided on the bus bar assembly 3. The first substrates 4 are arranged so as to correspond one by one to the respective power modules 2. Each of the first substrates 4 is arranged between one of the power modules 2 and the bus bar assembly 3. Each of the first substrates 4 is a drive substrate for controlling a current to be supplied to the power module 2 corresponding to the each of the first substrates 4. In the power conversion device according to the first embodiment, a configuration including three first substrates 4 is described, but a configuration including one first substrate 4 may be employed.

The second substrate 5 is provided on the bus bar assembly 3. The bus bar assembly 3 is arranged between the second substrate 5 and the first substrates 4. The second substrate 5 is fixed to the bus bar assembly 3 by a plurality of screws (not shown). The second substrate 5 is a control substrate for controlling each of the first substrates 4. The second substrate 5 may be provided on the power module installing member 1.

The smoothing capacitor 6 is provided on the bus bar assembly 3. The second substrate 5 is arranged between the smoothing capacitor 6 and the bus bar assembly 3. The smoothing capacitor 6 is connected to the bus bar assembly 3 and is also fixed to the bus bar assembly 3 by a plurality of electrical connection screws 7.

Figure 5:
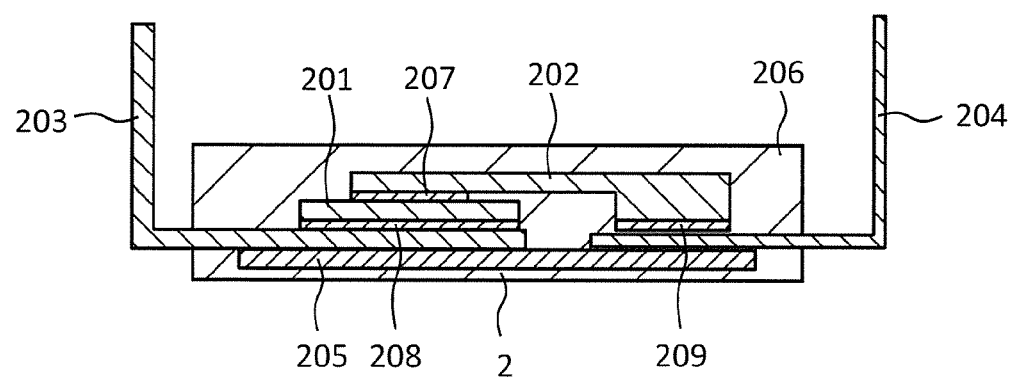
FIG. 5 is an enlarged sectional view for illustrating a power module of FIG. 3.

FIG. 5 is an enlarged sectional view for illustrating the power module 2 of FIG. 3. The power module 2 includes a semiconductor element 201, a semiconductor element wiring member 202, three bus bar connection terminals 203, a plurality of signal terminals 204, an insulating member 205, and a molded resin portion 206. In FIG. 5, one of the three bus bar connection terminals 203 is illustrated, and one of the plurality of signal terminals 204 is illustrated.

The semiconductor element 201 and the semiconductor element wiring member 202 are joined to each other through intermediation of a conductive joining member 207. The semiconductor element 201 and the bus bar connection terminal 203 are joined to each other through intermediation of a conductive joining member 208. The semiconductor element wiring member 202 and the signal terminal 204 are joined to each other through intermediation of a conductive joining member 209.

The bus bar connection terminals 203 and the signal terminals 204 are each provided on the insulating member 205. The molded resin portion 206 covers the semiconductor element 201, the semiconductor element wiring member 202, parts of the bus bar connection terminals 203, parts of the signal terminals 204, and the insulating member 205. The semiconductor element 201 is controlled by the first substrate 4 and the second substrate 5.

Figure 6:
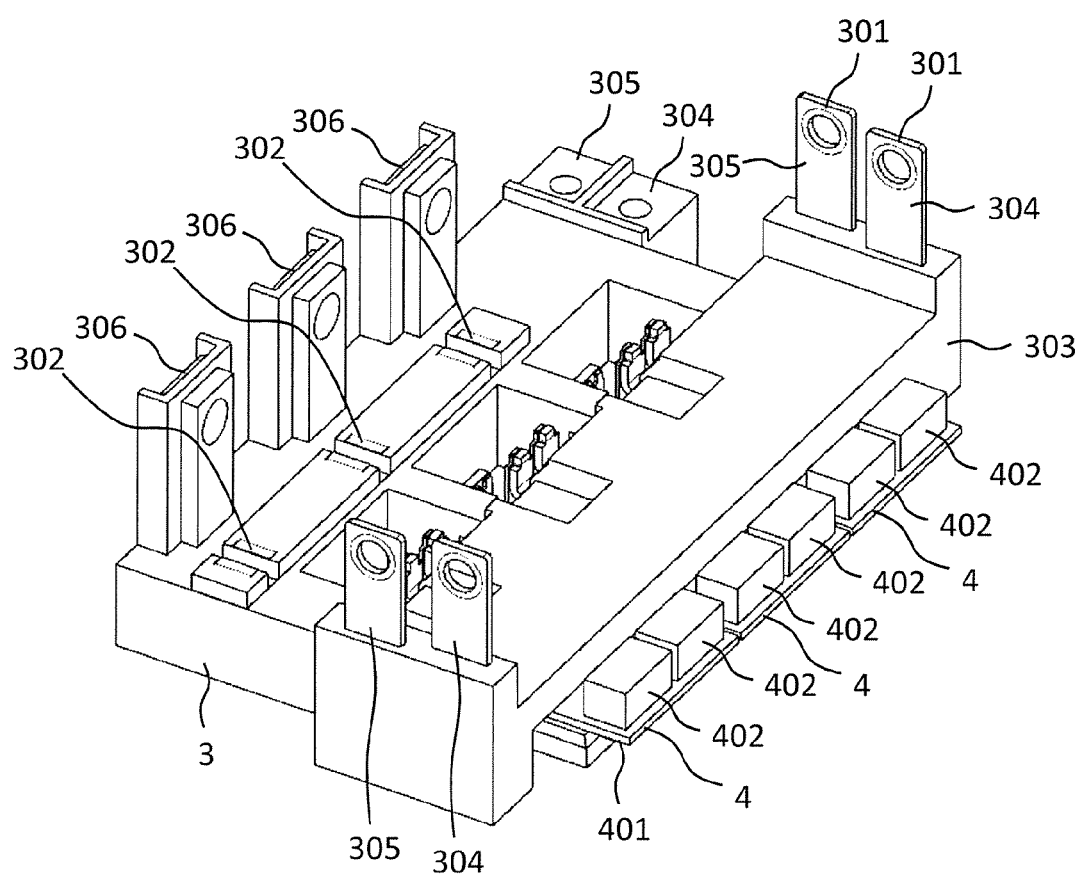
FIG. 6 is an enlarged perspective view for illustrating a bus bar assembly and first substrates of FIG. 1.
Figure 7:
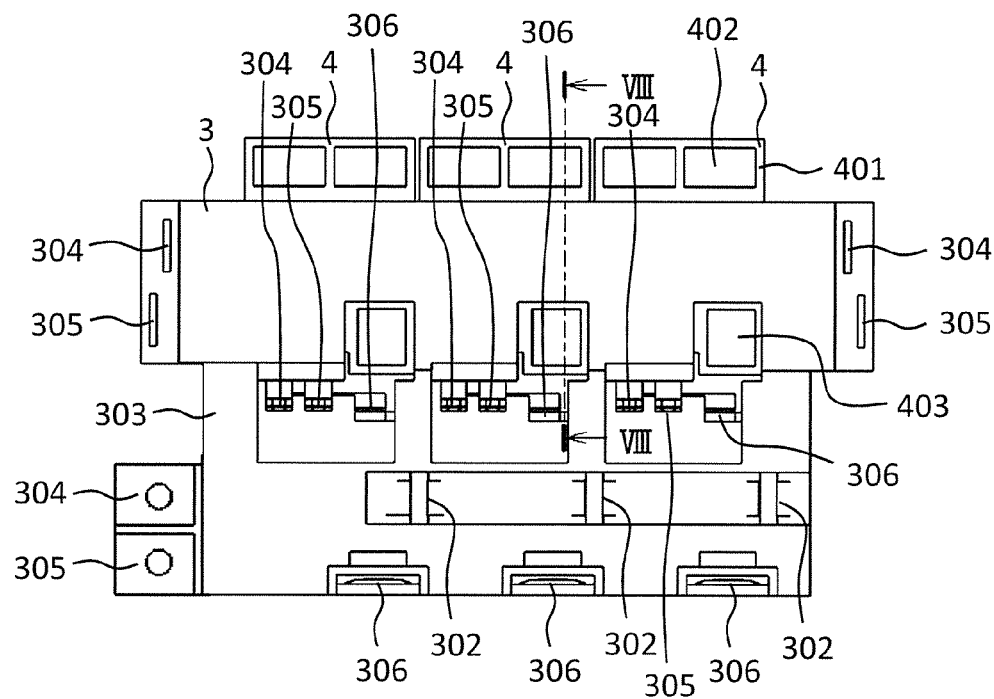
FIG. 7 is a plan view for illustrating the bus bar assembly and the first substrates of FIG. 6.
Figure 8:
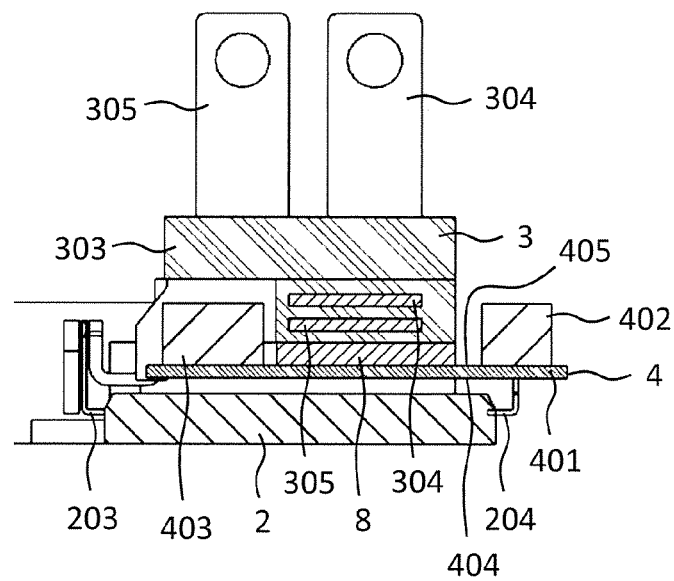
FIG. 8 is a sectional view taken along the line VIII-VIII of FIG. 7 when viewed in the direction of the arrows.

FIG. 6 is an enlarged perspective view for illustrating the bus bar assembly 3 and the first substrates 4 of FIG. 1. FIG. 7 is a plan view for illustrating the bus bar assembly 3 and the first substrates 4 of FIG. 6. FIG. 8 is a sectional view taken along the line VIII-VIII of FIG. 7 when viewed in the direction of the arrows.

The bus bar assembly 3 includes a plurality of bus bars 301, three current sensor cores 302, and an insulating frame 303. The plurality of bus bars 301 and the three current sensor cores 302 are integrally formed with the insulating frame 303.

The plurality of bus bars 301 include P bus bars 304, N bus bars 305, and three AC bus bars 306. The P bus bars 304 and the N bus bars 305 are, as illustrated in FIG. 1, connected to the smoothing capacitor 6.

The three bus bar connection terminals 203 in one power module 2 are connected one by one to the P bus bar 304, the N bus bar 305, and the AC bus bar 306, respectively. The three AC bus bars 306 are connected one by one to the corresponding bus bar connection terminals 203 in the respective three power modules 2.

The first substrate 4 includes a first printed wiring board 401, signal terminal connectors 402, and a first board-to-board connection connector 403. The signal terminal connectors 402 are provided as a first connector on the first printed wiring board 401. The first board-to-board connection connector 403 is provided as a second connector on the first printed wiring board 401.

The first printed wiring board 401 is formed into a plate shape. The first printed wiring board 401 is arranged between the power module 2 and the bus bar assembly 3. The first printed wiring board 401 is opposed to the power module 2. A surface opposed to the power module 2 in the first printed wiring board 401 is referred to as "power module opposing surface 404." A surface on the opposite side of the power module opposing surface 404 in the thickness direction of the first printed wiring board 401 is referred to as "connector mounting surface 405."

The connector mounting surface 405 is fixed to the bus bar assembly 3 by an adhesive 8. In other words, the first printed wiring board 401 is fixed to the bus bar assembly 3 by the adhesive 8.

The signal terminal connectors 402 and the first board-to-board connection connector 403 are each provided on the connector mounting surface 405. The signal terminal connectors 402 are connected to the signal terminals 204 of the power module 2 passing through the first printed wiring board 401.

Figure 9:
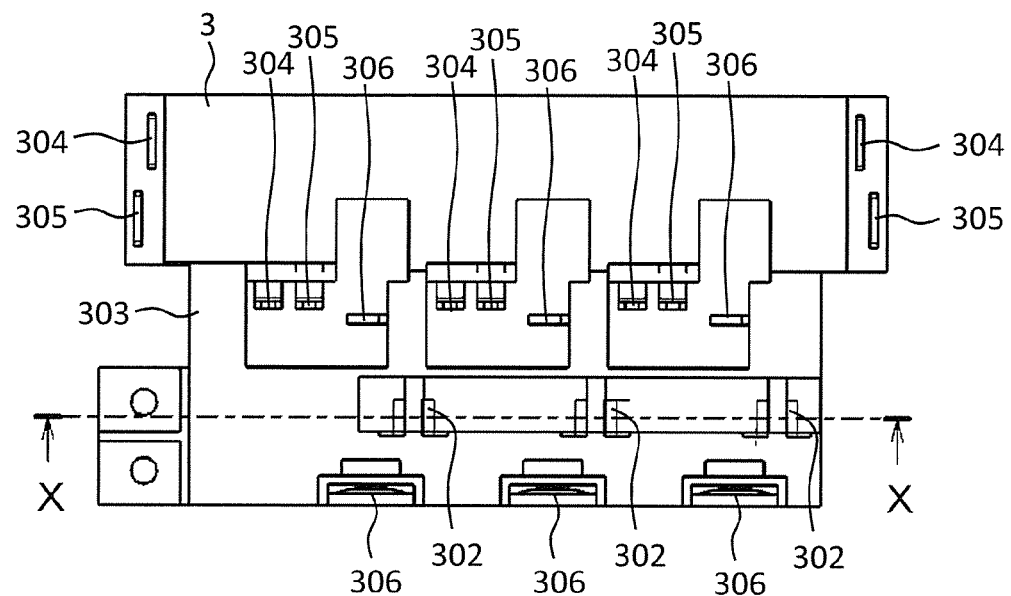
FIG. 9 is a plan view for illustrating the bus bar assembly of FIG. 7.
Figure 10:
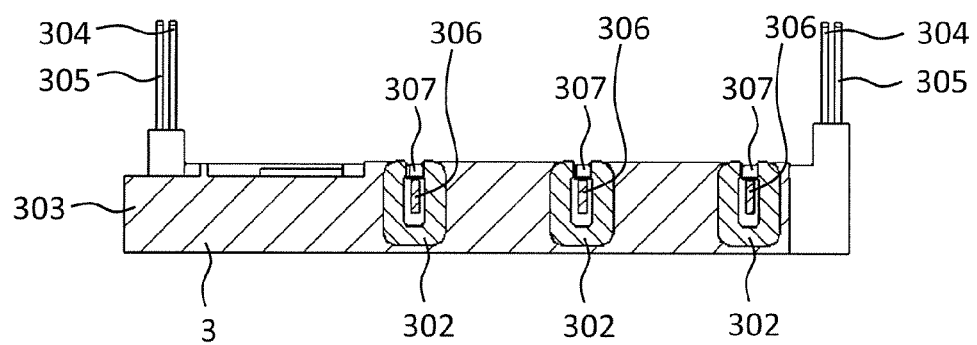
FIG. 10 is a sectional view taken along the line X-X of FIG. 9 when viewed in the direction of the arrows.

FIG. 9 is a plan view for illustrating the bus bar assembly 3 of FIG. 7. FIG. 10 is a sectional view taken along the line X-X of FIG. 9 when viewed in the direction of the arrows. In the insulating frame 303, the three AC bus bars 306 are arranged side by side. A direction in which the three AC bus bars 306 are arranged side by side matches the direction in which the three power modules 2 are arranged side by side.

The three current sensor cores 302 are provided so as to correspond one by one to the respective three AC bus bars 306. Each of the current sensor cores 302 is provided so as to surround one of the AC bus bars 306. A sensor insertion portion 307 is formed in each of the current sensor cores 302.

Figure 11:
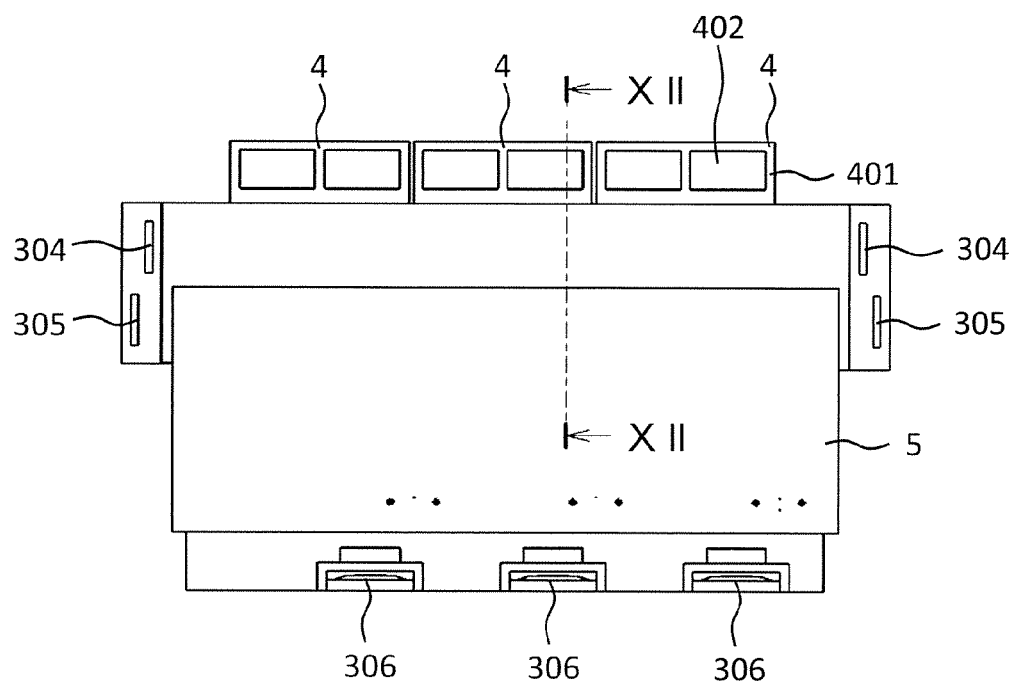
FIG. 11 is a plan view for illustrating the first substrates, the bus bar assembly, and a second substrate of FIG. 1.
Figure 12:
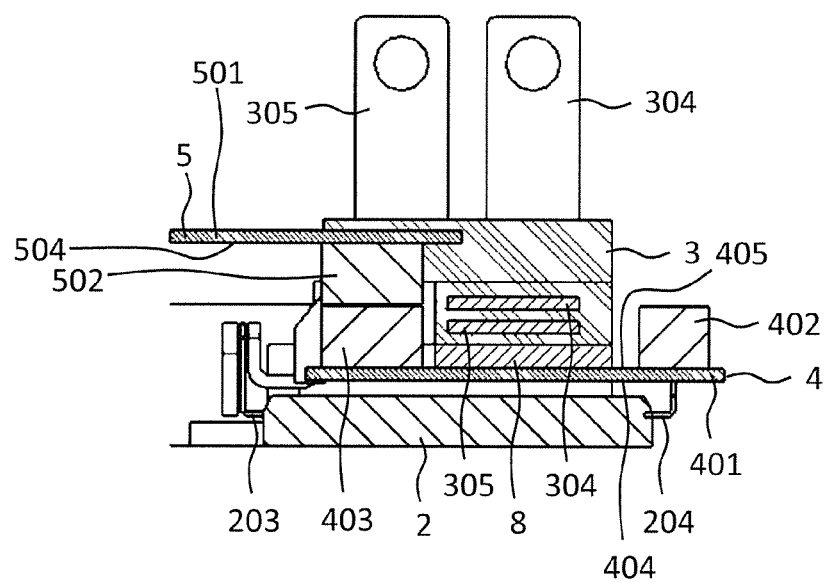
FIG. 12 is a sectional view taken along the line XII-XII of FIG. 11 when viewed in the direction of the arrows.
Figure 13:
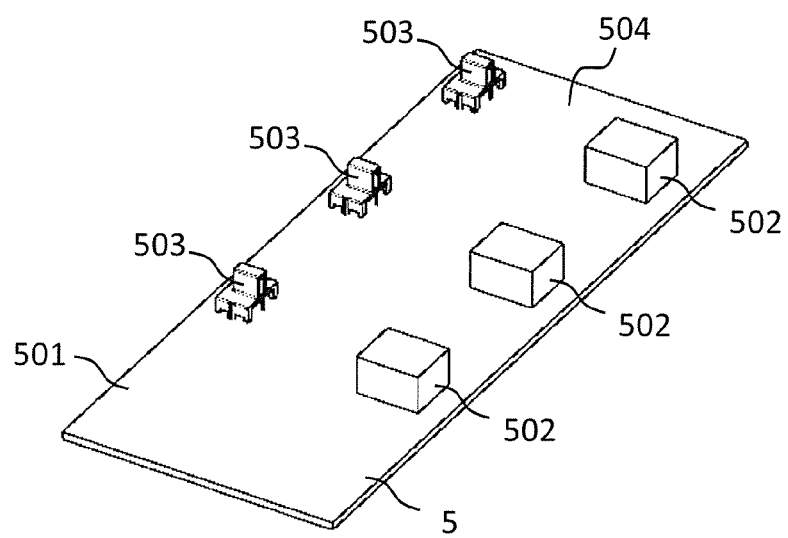
FIG. 13 is a perspective view for illustrating the second substrate of FIG. 11.

FIG. 11 is a plan view for illustrating the first substrates 4, the bus bar assembly 3, and the second substrate 5 of FIG. 1. FIG. 12 is a sectional view taken along the line XII-XII of FIG. 11 when viewed in the direction of the arrows. FIG. 13 is a perspective view for illustrating the second substrate 5 of FIG. 11. The second substrate 5 includes a second printed wiring board 501, three second board-to-board connection connectors 502, and three current sensors 503. Each of the second board-to-board connection connectors 502 is provided as a third connecter on the second printed wiring board 501. Each of the current sensors 503 is provided on the second printed wiring board 501.

The second printed wiring board 501 is formed into a plate shape. The bus bar assembly 3 is arranged between the second printed wiring board 501 and the first printed wiring boards 401. The second printed wiring board 501 is arranged so as to be opposed to the first printed wiring boards 401. A surface opposed to the first printed wiring boards 401 in the second printed wiring board 501 is referred to as "connector mounting surface 504." In FIG. 13, the connector mounting surface 504 in the second printed wiring board 501 is illustrated.

Each of the second board-to-board connection connectors 502 and each of the current sensors 503 are provided on the connector mounting surface 504 of the second printed wiring board 501.

The three first board-to-board connection connectors 403 and the three second board-to-board connection connectors 502 are connected one by one to each other. The three current sensors 503 are inserted one by one into the respective sensor insertion portions 307 of the three current sensor cores 302.

The signal terminal connectors 402, the first board-to-board connection connectors 403, and the second board-to-board connection connectors 502 are each arranged so as to be adjacent to the bus bar assembly 3 in the direction along the connector mounting surface 405.

Figure 14:
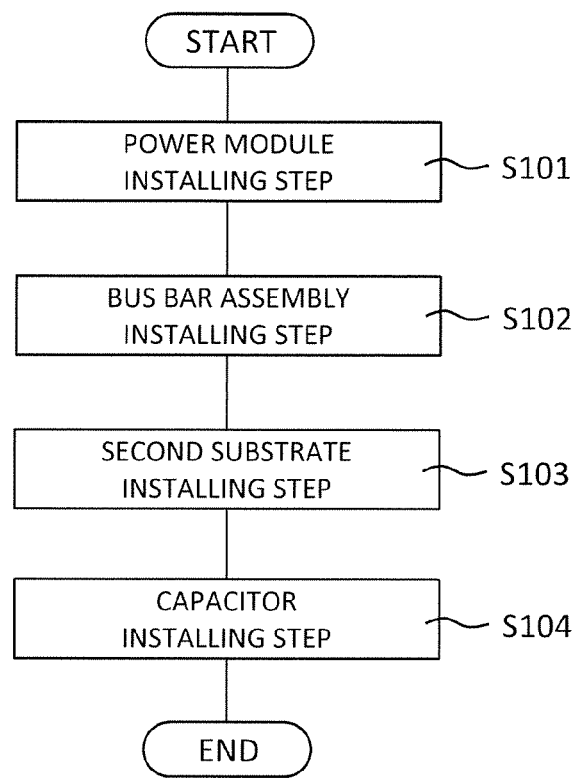
FIG. 14 is a flow chart for illustrating an assembling process for the power conversion device according to the first embodiment.
Figure 15:
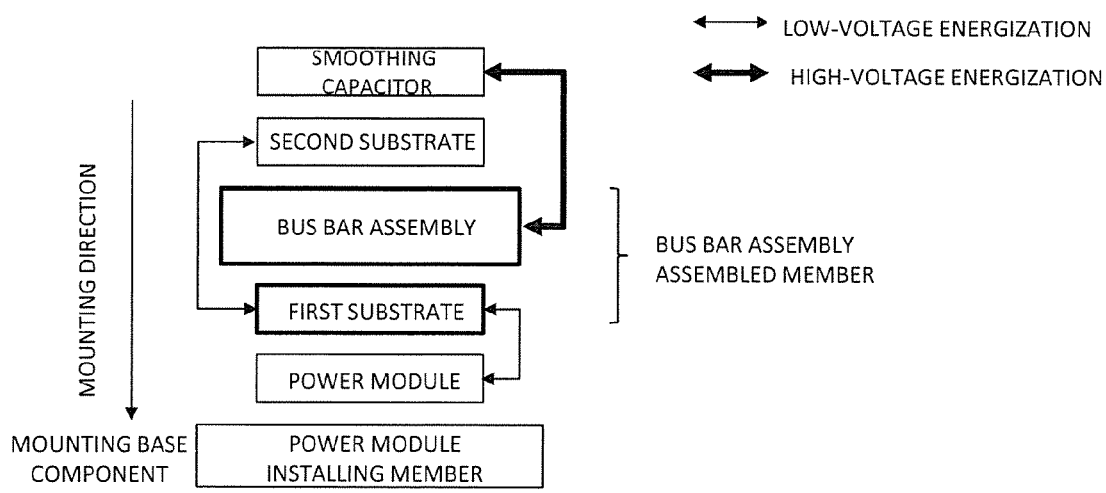
FIG. 15 is an explanatory diagram for illustrating a mounting direction of each of members forming the power conversion device according to the first embodiment, and electrical connection of each of the members.

Next, an assembling process for the power conversion device according to the first embodiment is described. FIG. 14 is a flow chart for illustrating the assembling process for the power conversion device according to the first embodiment. FIG. 15 is an explanatory diagram for illustrating a mounting direction of each of the members forming the power conversion device according to the first embodiment, and electrical connection of each of the members. First, in Step S101, a power module installing step is performed. In the power module installing step, each of the power modules 2 is fixed to the cooling plate 102. The fixing of each of the power modules 2 to the cooling plate 102 is performed by, for example, soldering.

After that, in Step S102, a bus bar assembly installing step is performed. In the bus bar assembly installing step, the bus bar assembly 3 to which each of the first substrates 4 is fixed is fixed to the support member 101. In FIG. 15, a member obtained by combining the bus bar assembly 3 and the first substrate 4 is described as "bus bar assembly assembled member." The fixing of the bus bar assembly 3 to the support member 101 is performed by, for example, screwing. When the bus bar assembly 3 is fixed to the support member 101, the signal terminals 204 of the power modules 2 are connected to the signal terminal connectors 402. A low-voltage current flows between the first substrate 4 and the power module 2.

After that, in Step S103, a second substrate installing step is performed. In the second substrate installing step, the second substrate 5 is fixed to the bus bar assembly 3. The fixing of the second substrate 5 to the bus bar assembly 3 is performed by, for example, screwing. When the second substrate 5 is fixed to the bus bar assembly 3, the first board-to-board connection connectors 403 and the second board-to-board connection connectors 502 are connected to each other. A low-voltage current flows between the first substrate 4 and the second substrate 5.

After that, in Step S104, a capacitor installing step is performed. In the capacitor installing step, the smoothing capacitor 6 is connected to the bus bar assembly 3. At this time, the second printed wiring board 501 is arranged between the bus bar assembly 3 and the smoothing capacitor 6. Further, the smoothing capacitor 6 is connected to the P bus bars 304 and the N bus bars 305 in the bus bar assembly 3. The connection of the smoothing capacitor 6 to the P bus bars 304 and the N bus bars 305 is performed via the electrical connection screws 7. A high-voltage current flows between the bus bar assembly 3 and the smoothing capacitor 6. With the above-mentioned steps, the assembly of the power conversion device is ended.

As described above, the power conversion device according to the first embodiment includes the power module installing member 1, the power module 2, the bus bar assembly 3, the first substrate 4, and the second substrate 5. The power module 2 is provided on the power module installing member 1. The bus bar assembly 3 is provided on the power module installing member 1. The first substrate 4 is provided on the bus bar assembly 3. The second substrate 5 is provided on the bus bar assembly 3. The power module 2 is arranged between the power module installing member 1 and the bus bar assembly 3.

The first substrate 4 includes the first printed wiring board 401 arranged between the power module 2 and the bus bar assembly 3, and the signal terminal connector 402 and the first board-to-board connection connector 403 which are each provided on the first printed wiring board 401. The second substrate 5 includes the second printed wiring board 501 and the second board-to-board connection connector 502 provided on the second printed wiring board 501. The bus bar assembly 3 is arranged between the first printed wiring board 401 and the second printed wiring board 501. The signal terminal connector 402 is connected to the signal terminal 204 of the power module 2. The first board-to-board connection connector 403 and the second board-to-board connection connector 502 are connected to each other.

With this configuration, the power module 2 is provided on the power module installing member 1, and the first substrate 4 is provided on the power module installing member 1 through intermediation of the bus bar assembly 3. In this manner, the first substrate 4 and the power module 2 can be fixed to each other without using a screw. As a result, a region in which an electronic component is mountable in the first printed wiring board 401 can be enlarged.

Further, with this configuration, a step of soldering the signal terminal 204 of the power module 2 to the first printed wiring board 401 is eliminated. As a result, a region in which the signal terminal 204 is soldered in the first printed wiring board 401 can be reduced, and further, the number of assembling steps of the power conversion device can be reduced.

Further, the bus bar assembly 3 includes the AC bus bar 306 connected to the bus bar connection terminal 203 of the power module 2, and the current sensor core 302 which is provided so as to surround the AC bus bar 306, and has the sensor insertion portion 307 formed therein. The second substrate 5 includes the current sensor 503 provided on the second printed wiring board 501. The current sensor 503 is inserted into the sensor insertion portion 307.

When three current sensors are provided in the bus bar assembly, it is required to connect, to the second printed wiring board, three current signal terminals for transmitting signals output from the current sensors. In order to connect each of the current signal terminals to the second printed wiring board, it is required to highly accurately position the second printed wiring board with respect to the bus bar assembly. In contrast, in the power conversion device according to the first embodiment, the current sensor 503 is provided on the second printed wiring board 501. Thus, it is not required to highly accurately position the second printed wiring board 501 with respect to the bus bar assembly 3. As a result, the power conversion device can be easily assembled.

Further, the first printed wiring board 401 is fixed to the bus bar assembly 3 by the adhesive 8. With this configuration, the first printed wiring board 401 can be fixed to the bus bar assembly 3 without using a screw. Further, when the bus bar assembly 3 is mounted to the power module installing member 1, the signal terminal 204 of the power module 2 is connected to the signal terminal connector 402. In this manner, the power conversion device can be easily assembled.

Further, the power conversion device according to the first embodiment includes the smoothing capacitor 6 connected to the P bus bar 304 and the N bus bar 305 of the bus bar assembly 3. The second printed wiring board 501 is arranged between the bus bar assembly 3 and the smoothing capacitor 6. With this configuration, the power module installing member 1, the power module 2, the first substrate 4, the bus bar assembly 3, the second substrate 5, and the smoothing capacitor 6 can be arranged side by side in the Z direction. In this manner, a projection area of the power conversion device in the Z direction can be reduced.

Second Embodiment

Figure 16:
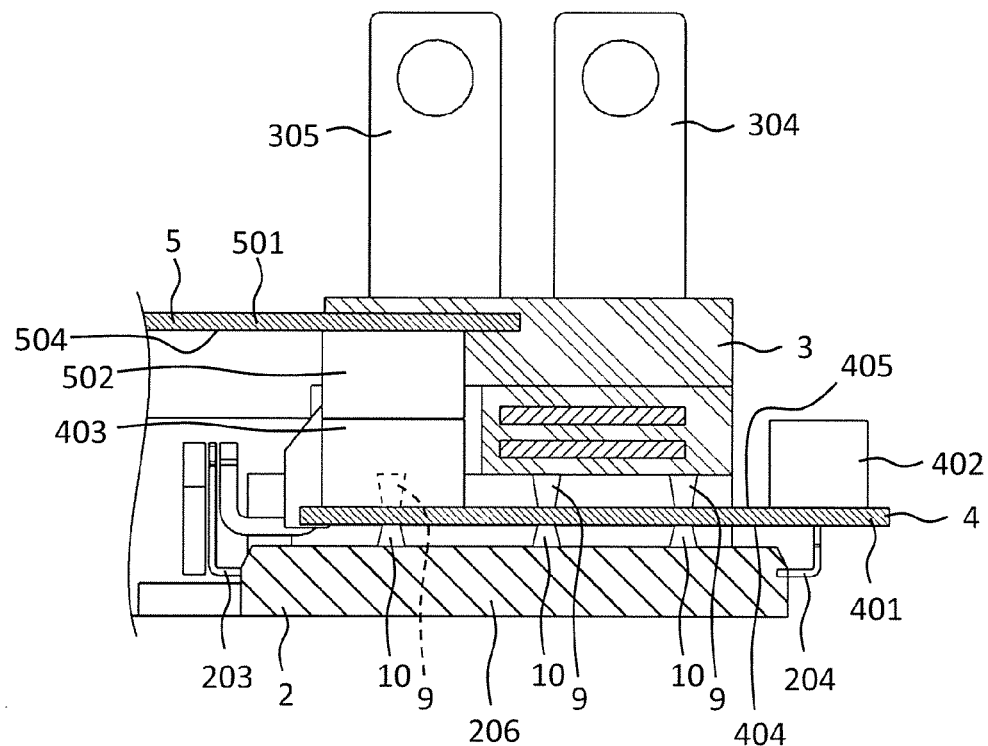
FIG. 16 is a sectional view for illustrating a main part of a power conversion device according to a second embodiment of this disclosure.

FIG. 16 is a sectional view for illustrating a main part of a power conversion device according to a second embodiment of this disclosure. The power conversion device according to the second embodiment includes a plurality of assembly-side protruding portions 9 and a plurality of module-side protruding portions 10. The first printed wiring board 401 is not caused to adhere to the bus bar assembly 3 via an adhesive unlike the power conversion device according to the first embodiment. The mounting of the first printed wiring board 401 to the bus bar assembly 3 is performed via a snap-fit mechanism (not shown) provided on the bus bar assembly 3. Thus, the first printed wiring board 401 is easily mounted to and removed from the bus bar assembly 3.

Each of the assembly-side protruding portions 9 is provided on the bus bar assembly 3. Each of the assembly-side protruding portions 9 protrudes from the bus bar assembly 3 toward the first printed wiring board 401. Each of the assembly-side protruding portions 9 is brought into contact with the connector mounting surface 405 of the first printed wiring board 401.

Each of the module-side protruding portions 10 is provided on the molded resin portion 206 of the power module 2. Each of the module-side protruding portions 10 protrudes from the molded resin portion 206 toward the first printed wiring board 401. Each of the module-side protruding portions 10 is brought into contact with the power module opposing surface 404 of the first printed wiring board 401.

When the plurality of assembly-side protruding portions 9 and the plurality of module-side protruding portions 10 sandwich the first printed wiring board 401, the first substrate 4 is fixed to the power module 2 and the bus bar assembly 3.

Each of the assembly-side protruding portions 9 and each of the module-side protruding portions 10 are arranged so as to overlap each other one by one when viewed in the thickness direction of the first printed wiring board 401.

Other configurations of the power conversion device according to the second embodiment are similar to those of the power conversion device according to the first embodiment.

As described above, the power conversion device according to the second embodiment includes the assembly-side protruding portion 9 and the module-side protruding portion 10. The assembly-side protruding portion 9 is provided on the bus bar assembly 3, and is brought into contact with the first printed wiring board 401. The module-side protruding portion 10 is provided on the power module 2, and is brought into contact with the first printed wiring board 401. The assembly-side protruding portion 9 and the module-side protruding portion 10 sandwich the first printed wiring board 401 so that the first substrate 4 is fixed to the power module 2 and the bus bar assembly 3.

With this configuration, the first substrate 4 can be fixed to the power module 2 and the bus bar assembly 3 without using a screw. In this manner, the region in which the electronic component is mountable in the first printed wiring board 401 can be enlarged. Further, the assembly-side protruding portion 9 and the module-side protruding portion 10 can each be positioned so as to come into contact with a region in which no component is mounted in the first printed wiring board 401. In this manner, a degree of freedom of component mounting in the first printed wiring board 401 can be enhanced.

Further, the assembly-side protruding portion 9 and the module-side protruding portion 10 are arranged so as to overlap each other when viewed in the thickness direction of the first printed wiring board 401. With this configuration, the first substrate 4 can be more firmly fixed with respect to the power module 2 and the bus bar assembly 3.

Third Embodiment

Figure 17:
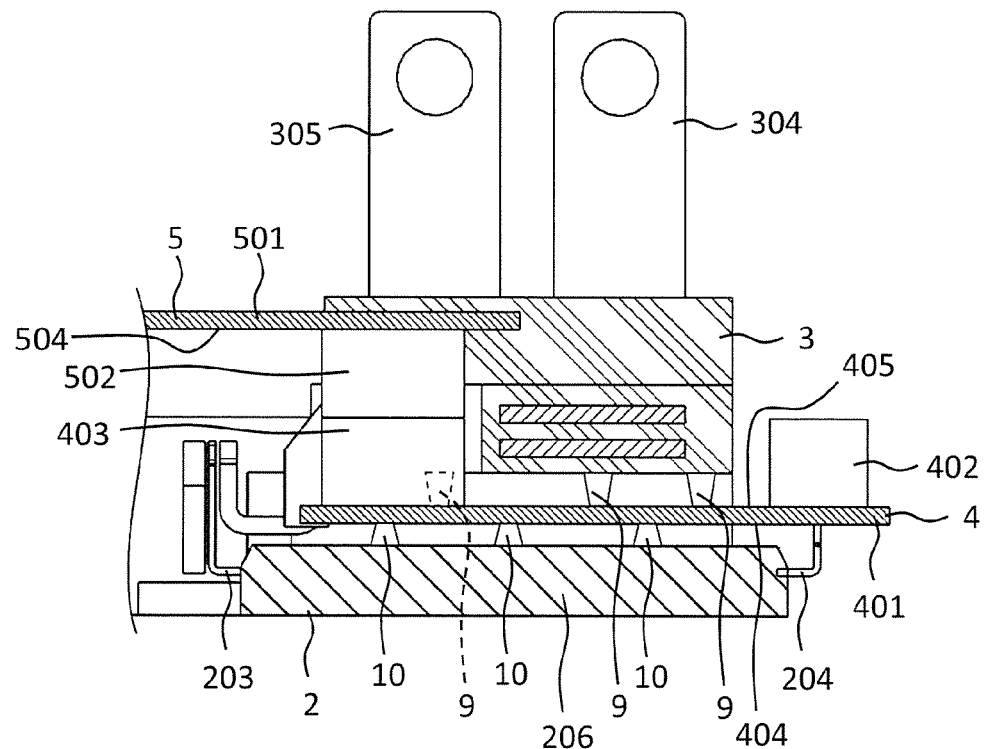
FIG. 17 is a sectional view for illustrating a main part of a power conversion device according to a third embodiment of this disclosure.

FIG. 17 is a sectional view for illustrating a main part of a power conversion device according to a third embodiment of this disclosure. In the power conversion device according to the third embodiment, the assembly-side protruding portions 9 and the module-side protruding portions 10 are arranged so as to be prevented from overlapping each other when viewed in the thickness direction of the first printed wiring board 401.

Other configurations of the power conversion device according to the third embodiment are similar to those of the power conversion device according to the second embodiment.

As described above, in the power conversion device according to the third embodiment, the assembly-side protruding portion 9 and the module-side protruding portion 10 are arranged so as to be prevented from overlapping each other when viewed in the thickness direction of the first printed wiring board 401. With this configuration, restriction in position of each of the assembly-side protruding portion 9 and the module-side protruding portion 10 can be relaxed.

Fourth Embodiment

Figure 18:
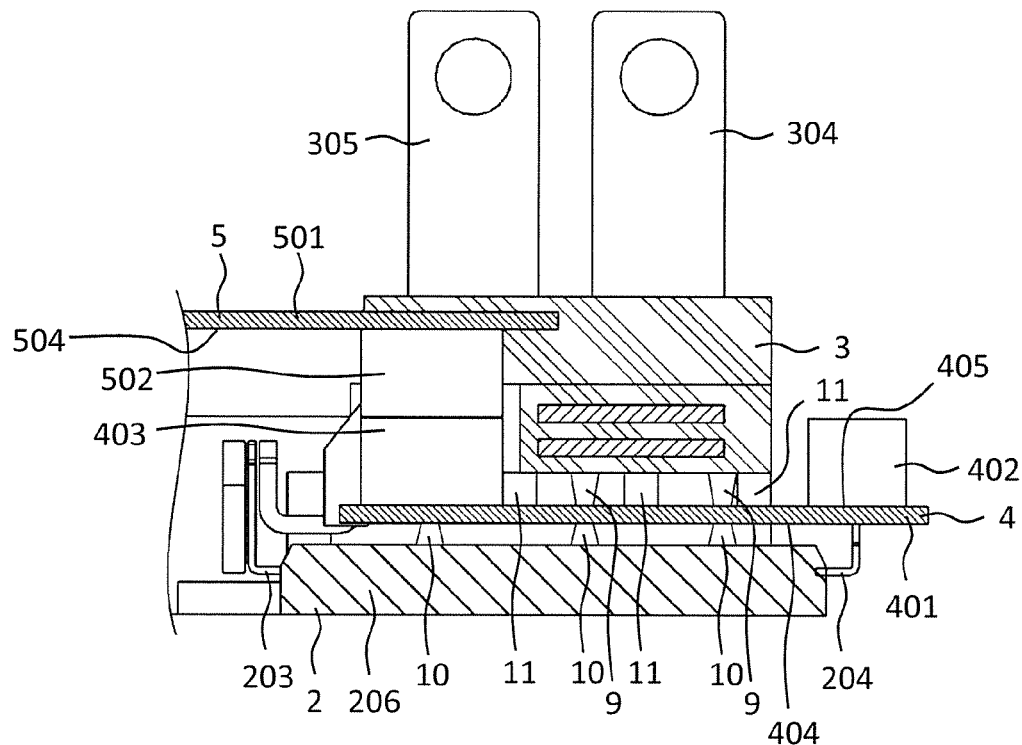
FIG. 18 is a sectional view for illustrating a main part of a power conversion device according to a fourth embodiment of this disclosure.

FIG. 18 is a sectional view for illustrating a main part of a power conversion device according to a fourth embodiment of this disclosure. In the power conversion device according to the fourth embodiment, as compared to the power conversion device according to the second embodiment, the first printed wiring board 401 is fixed to the bus bar assembly 3 by an adhesive 11.

Other configurations of the power conversion device according to the fourth embodiment are similar to those of the power conversion device according to the second embodiment.

As described above, the power conversion device according to the fourth embodiment includes the assembly-side protruding portion 9 and the module-side protruding portion 10. The assembly-side protruding portion 9 is provided on the bus bar assembly 3, and is brought into contact with the first printed wiring board 401. The module-side protruding portion 10 is provided on the power module 2, and is brought into contact with the first printed wiring board 401. The first printed wiring board 401 is fixed to the bus bar assembly 3 by the adhesive 11.

With this configuration, the first substrate 4 is fixed to the bus bar assembly 3 by the adhesive 11, and the first substrate 4 is fixed to the power module 2 and the bus bar assembly 3 by the assembly-side protruding portion 9 and the module-side protruding portion 10. In this manner, an earthquake-resistance strength in the fixing of the first substrate 4 with respect to the power module 2 and the bus bar assembly 3 can be enhanced.

Fifth Embodiment

Figure 19:
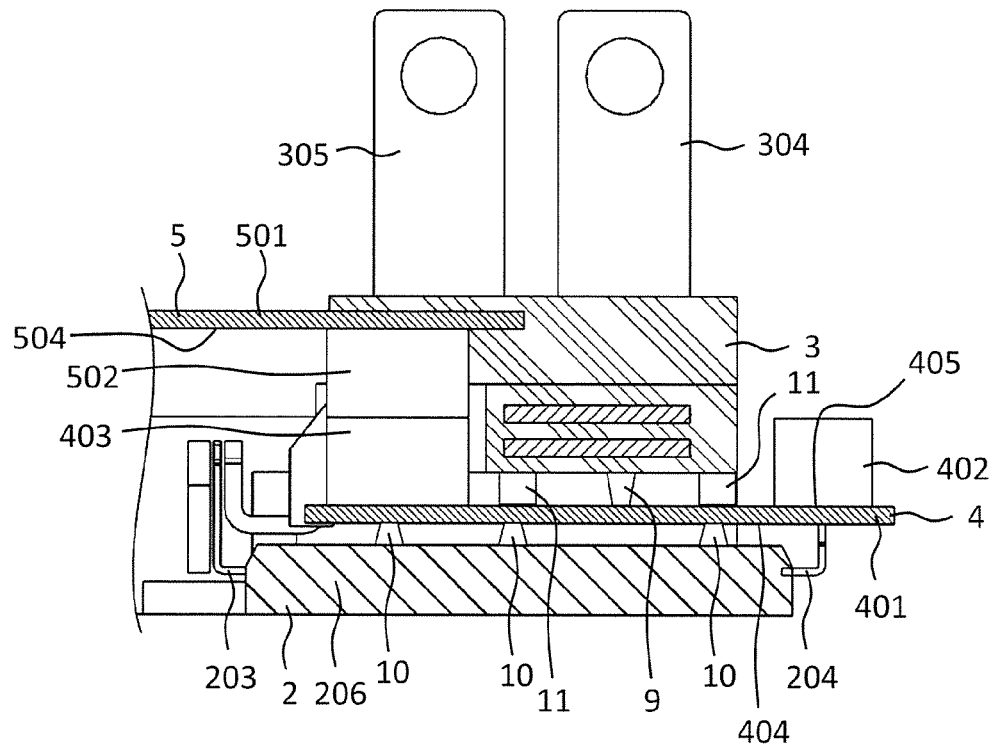
FIG. 19 is a sectional view for illustrating a main part of a power conversion device according to a fifth embodiment of this disclosure.

FIG. 19 is a sectional view for illustrating a main part of a power conversion device according to a fifth embodiment of this disclosure. In the power conversion device according to the fifth embodiment, as compared to the power conversion device according to the third embodiment, the first printed wiring board 401 is fixed to the bus bar assembly 3 by the adhesive 11.

Other configurations of the power conversion device according to the fifth embodiment are similar to those of the power conversion device according to the third embodiment.

As described above, the power conversion device according to the fifth embodiment includes the assembly-side protruding portion 9 and the module-side protruding portion 10. The assembly-side protruding portion 9 is provided on the bus bar assembly 3, and is brought into contact with the first printed wiring board 401. The module-side protruding portion 10 is provided on the power module 2, and is brought into contact with the first printed wiring board 401. The first printed wiring board 401 is fixed to the bus bar assembly 3 via the adhesive 11.

With this configuration, similarly to the power conversion device according to the fourth embodiment, the earthquake-resistance strength in the fixing of the first substrate 4 with respect to the power module 2 and the bus bar assembly 3 can be enhanced.

Sixth Embodiment

Figure 20:
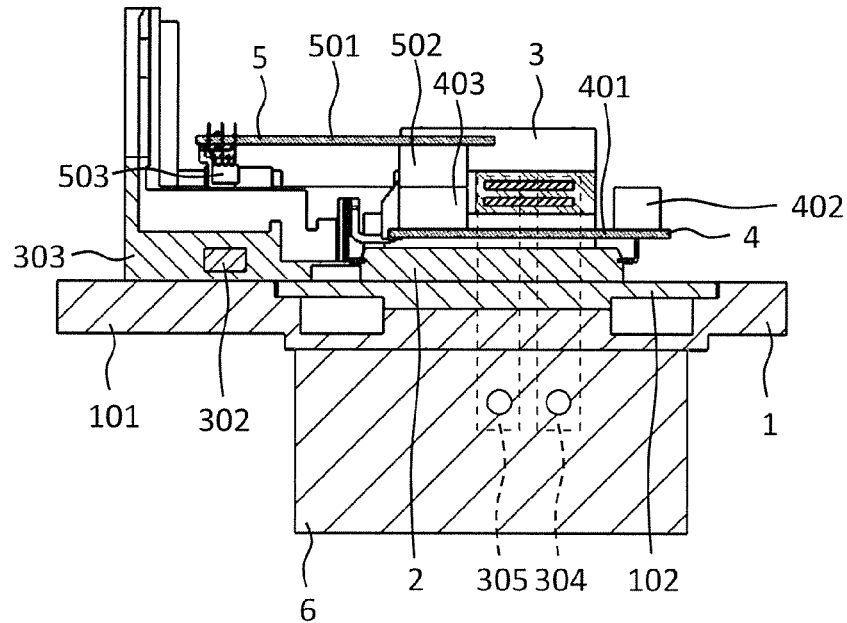
FIG. 20 is a sectional view for illustrating a power conversion device according to a sixth embodiment of this disclosure.

FIG. 20 is a sectional view for illustrating a power conversion device according to a sixth embodiment of this disclosure. In the power conversion device according to the sixth embodiment, the power module installing member 1 is arranged between the power module 2 and the smoothing capacitor 6.

The P bus bars 304 and the N bus bars 305 in the bus bar assembly 3 each extend from the insulating frame 303 to the smoothing capacitor 6. In the power module installing member 1, through holes (not shown) through which the P bus bars 304 and the N bus bars 305 are inserted, respectively, are formed.

Other configurations of the power conversion device according to the sixth embodiment are similar to those of the power conversion devices according to the first embodiment to the fifth embodiment.

Figure 21:
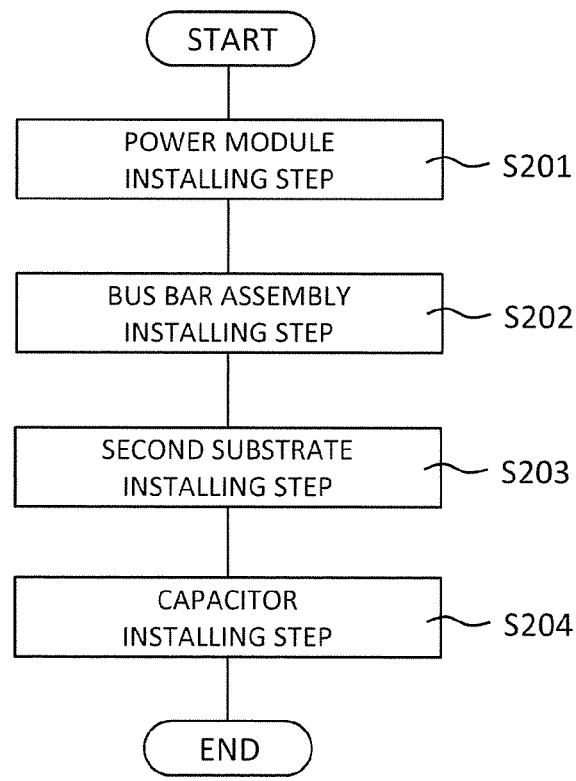
FIG. 21 is a flow chart for illustrating an assembling process for the power conversion device according to the sixth embodiment.
Figure 22:
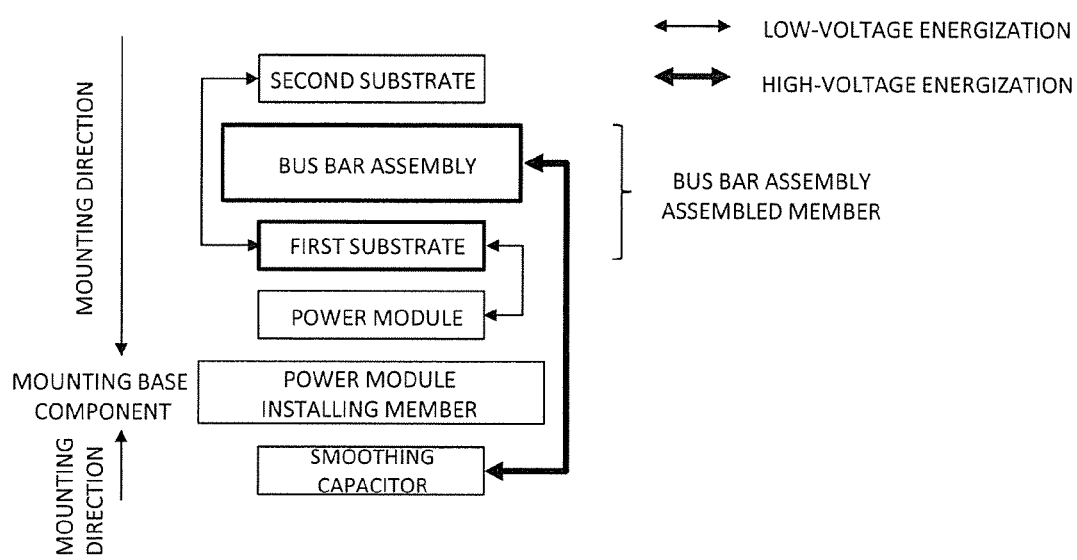
FIG. 22 is an explanatory diagram for illustrating a mounting direction of each of members forming the power conversion device according to the sixth embodiment, and electrical connection of each of the members.

FIG. 21 is a flow chart for illustrating an assembling process for the power conversion device according to the sixth embodiment. FIG. 22 is an explanatory diagram for illustrating a mounting direction of each of the members forming the power conversion device according to the sixth embodiment, and electrical connection of each of the members. A power module installing step of Step S201 is similar to the power module installing step of Step S101 in the power conversion device according to the first embodiment. A bus bar assembly installing step of Step S202 is similar to the bus bar assembly installing step of Step S102 in the power conversion device according to the first embodiment. A second substrate installing step of Step S203 is similar to the second substrate installing step of Step S103 in the power conversion device according to the first embodiment.

After the second substrate installing step, in Step S204, a capacitor installing step is performed. The capacitor installing step may be performed after the bus bar assembly installing step and before the second substrate installing step. In the capacitor installing step, the smoothing capacitor 6 is connected to the bus bar assembly 3. At this time, the power module installing member 1 is arranged between the power module 2 and the smoothing capacitor 6. Further, the smoothing capacitor 6 is connected to the P bus bars 304 and the N bus bars 305 in the bus bar assembly 3. The connection of the smoothing capacitor 6 to the P bus bars 304 and the N bus bars 305 is performed via the electrical connection screws 7. A high-voltage current flows between the bus bar assembly 3 and the smoothing capacitor 6. With the above-mentioned steps, the assembly of the power conversion device is ended.

As described above, the power conversion device according to the sixth embodiment includes the smoothing capacitor 6 connected to the P bus bar 304 and the N bus bar 305 of the bus bar assembly 3. The power module installing member 1 is arranged between the power module 2 and the smoothing capacitor 6. With this configuration, the smoothing capacitor 6 can be installed when there is no space to install the smoothing capacitor 6 in a region separated away from the first substrate 4 with respect to the second substrate 5 in the Z direction. Further, with this configuration, the smoothing capacitor 6, the power module installing member 1, the power module 2, the first substrate 4, the bus bar assembly 3, and the second substrate 5 can be arranged side by side in the Z direction. In this manner, the projection area of the power conversion device in the Z direction can be reduced.

What is claimed is:

1. A power conversion device, comprising:
   a power module installing member;
   a power module provided on the power module installing member;
   a bus bar assembly provided on the power module installing member;
   a first substrate provided on the bus bar assembly; and
   a second substrate provided on one of the power module installing member or the bus bar assembly,
   wherein the power module is arranged between the power module installing member and the bus bar assembly,
   wherein the first substrate includes a first printed wiring board arranged between the power module and the bus bar assembly, and a first connector and a second connector which are each provided on the first printed wiring board,
   wherein the second substrate includes a second printed wiring board and a third connector provided on the second printed wiring board,
   wherein the bus bar assembly is arranged between the first printed wiring board and the second printed wiring board,
   wherein the first connector penetrates through the first printed wiring board and is directly connected to a signal terminal of the power module and does not overlap with the bus bar assembly in a direction normal to a surface of the first substrate, and
   wherein the second connector and the third connector are connected to each other.

2. The power conversion device according to claim 1,
   wherein the bus bar assembly includes an AC bus bar connected to a bus bar connection terminal of the power module, and a current sensor core which is provided so as to surround the AC bus bar, and has a sensor insertion portion formed therein, and
   wherein the second substrate includes a current sensor which is provided on the second printed wiring board, and is inserted into the sensor insertion portion.

3. The power conversion device according to claim 1, wherein the first printed wiring board is fixed to the bus bar assembly by an adhesive.

4. The power conversion device according to claim 1, further comprising:
   an assembly-side protruding portion which is provided on the bus bar assembly, and is brought into contact with the first printed wiring board; and
   a module-side protruding portion which is provided on the power module, and is brought into contact with the first printed wiring board,
   wherein the assembly-side protruding portion and the module-side protruding portion sandwich the first printed wiring board so that the first substrate is fixed to the power module and the bus bar assembly.

5. The power conversion device according to claim 4, wherein the assembly-side protruding portion and the module-side protruding portion are arranged so as to overlap each other when viewed in a thickness direction of the first printed wiring board.

6. The power conversion device according to claim 4, wherein the assembly-side protruding portion and the module-side protruding portion are arranged so as to be prevented from overlapping each other when viewed in a thickness direction of the first printed wiring board.

7. The power conversion device according to claim 1, further comprising a smoothing capacitor connected to a P bus bar and an N bus bar of the bus bar assembly,
   wherein the second printed wiring board is arranged between the bus bar assembly and the smoothing capacitor.

8. The power conversion device according to claim 1, further comprising a smoothing capacitor connected to a P bus bar and an N bus bar of the bus bar assembly,
   wherein the power module installing member is arranged between the power module and the smoothing capacitor.

* * * * *